(12) United States Patent
Fechner et al.

(10) Patent No.: US 6,576,508 B2
(45) Date of Patent: Jun. 10, 2003

(54) FORMATION OF A FRONTSIDE CONTACT ON SILICON-ON-INSULATOR SUBSTRATE

(75) Inventors: Paul S. Fechner, Plymouth, MN (US); Cheisan Yue, Roseville, MN (US)

(73) Assignee: Honeywell International Inc, Morristown, NJ (US)

(*) Notice: Subject to any disclaimer, the term of this patent is extended or adjusted under 35 U.S.C. 154(b) by 0 days.

(21) Appl. No.: 10/227,744

(22) Filed: Aug. 26, 2002

(65) Prior Publication Data

US 2002/0195638 A1 Dec. 26, 2002

Related U.S. Application Data

(62) Division of application No. 09/995,400, filed on Nov. 27, 2001
(60) Provisional application No. 60/275,764, filed on Mar. 14, 2001.

(51) Int. Cl.⁷ .......................................... H01L 21/8242
(52) U.S. Cl. ................ 438/243; 438/149; 438/152; 438/243; 438/717; 438/759
(58) Field of Search ............................ 438/149, 152, 438/243, 717, 759

(56) References Cited

U.S. PATENT DOCUMENTS

| | | | |
|---|---|---|---|
| 5,049,521 A | 9/1991 | Belanger et al. | 437/62 |
| 5,569,621 A | 10/1996 | Yallup et al. | 437/62 |
| 5,610,083 A | 3/1997 | Chan et al. | 437/21 |
| 6,355,511 B1 * | 3/2002 | Lukanc et al. | 438/152 |

FOREIGN PATENT DOCUMENTS

| | | | | |
|---|---|---|---|---|
| GB | 2 346 260 A | 8/2000 | | H01L/21/74 |
| JP | 9 153468 | 6/1997 | | H01L/21/28 |

* cited by examiner

Primary Examiner—Hoai Ho
Assistant Examiner—Mai-Huong Tran
(74) Attorney, Agent, or Firm—McDonnell Boehnen Hulbert & Berghoff

(57) ABSTRACT

A method of forming a frontside contact to a Silicon-On-Insulator (SOI) wafer is described. A connection polysilicon connects a silicon substrate layer to a contact plug. This connection provides a means to ground or bias the bottom substrate of the SOI wafer. Spacers may be added to provide additional doping.

13 Claims, 7 Drawing Sheets

US 6,576,508 B2

FORMATION OF A FRONTSIDE CONTACT ON SILICON-ON-INSULATOR SUBSTRATE

RELATED APPLICATION

This patent application is a divisional application of U.S. application Ser. No. 09/995,400 filed Nov. 27, 2001. U.S. application Ser. No. 09/995,400 is hereby incorporated by reference herein in its entirety, including the drawings which claims benefit of Prov. No. 60/275,764 filed Mar. 14, 2001.

FIELD

The present invention relates generally to device processing of Silicon-On-Insulator (SOI) wafers, and more particularly, relates to a method of forming a frontside contact to the silicon substrate of a SOI wafer.

BACKGROUND

SOI is a device processing technique that places an insulating layer (e.g. a buried oxide layer) over the silicon substrate. Transistors are then fabricated in a layer of silicon located on top of the insulating layer. This technique may provide higher speeds and use less power by reducing capacitance, making device operation on SOI superior to the conventional Complementary Metal-Oxide Semiconductor (CMOS) techniques.

In many applications it is desirable to ground or bias the silicon substrate of an SOI circuit. However, in most of the more advanced packaging technologies, such as flip chip and die stacking, making a connection to the substrate is cost prohibitive. Therefore, connecting the substrate to a frontside contact is necessary. The standard semiconductor manufacturing process must typically be modified to make this frontside contact.

Submicron lithography requires a high degree of planarity in the contact dielectric to define the contact and metal interconnect layers. In order to make simultaneous contact to the gate polysilicon, the source/drain regions, and the underlying substrate, the selectivity requirements must be increased significantly to be able to etch the planarized contact dielectric down to the silicon substrate. These requirements increase the cost of manufacturing.

A frontside contact formation process was described by Brady, et al. in U.S. Pat. No. 5,314,841, "Method of Forming a Frontside Contact to the Silicon Substrate of a SOI Wafer." This process forms a frontside contact without planarization of the structure as seen in FIG. 1. This requires significant adjustment of the contact etch to be compatible with today's planarized contact dielectric processes.

U.S. patent application Ser. No. 09/163,687, titled "Method for Forming a Frontside Contact to the Silicon Substrate of a SOI Wafer in the Presence of Planarized Contact Dielectrics," which is assigned to the same assignee as the present invention, describes another technique for forming such a contact. This technique includes a positive profile and a local interconnect as seen in FIG. 2. The positive profile impacts density, while the local interconnect is not required for all SOI processes.

The technique disclosed herein is believed to improve upon these prior attempts.

SUMMARY

Exemplary embodiments are described for connecting a silicon substrate layer of an SOI wafer to a frontside contact. A hole is etched through a field oxide layer and a buried oxide layer, exposing the silicon substrate layer in the area in which the frontside contact is to be formed. An implant is performed in the silicon substrate layer in the area of the hole. Connection polysilicon is then deposited in the hole and etched to form the frontside contact. A contact dielectric layer is then deposited. A contact hole is etched into the contact dielectric layer and filled with a refractory metal forming a contact plug. A metal pad is then located above the contact plug to provide surface wiring to other components on the wafer. Placing doped spacers in the hole prior to depositing the connection polysilicon can provide additional doping.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

First Exemplary Embodiment

Figure 1:
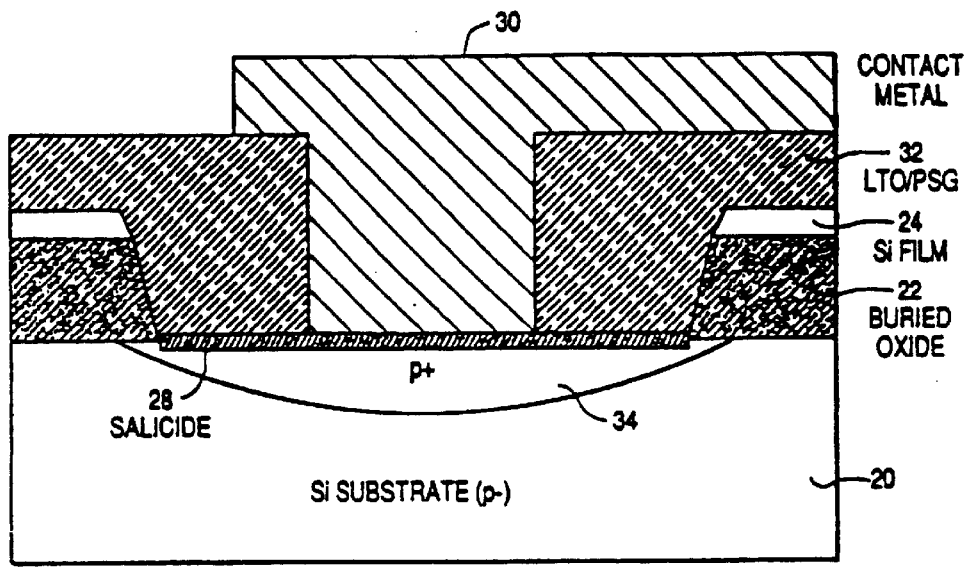
FIG. 1 is a cross sectional view of the prior art demonstrating a method of forming a frontside contact without planarization of the structure.
Figure 2:
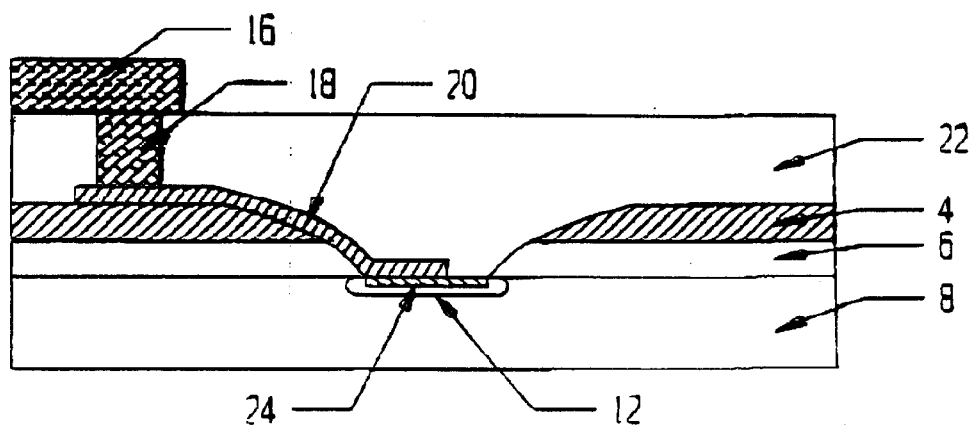
FIG. 2 is a cross sectional view of the prior art demonstrating a method of forming a frontside contact using positive profile control and a local interconnect.
Figure 3:
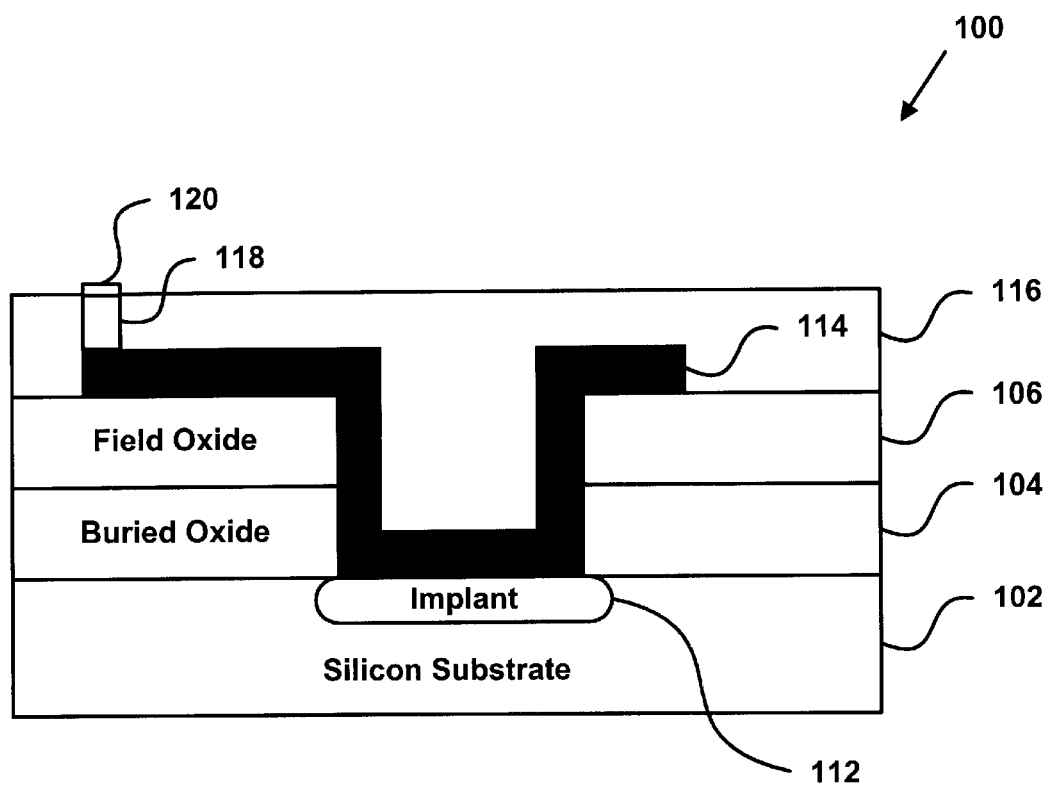
FIG. 3 is a cross sectional view of a frontside contact according to a first exemplary embodiment.

FIG. 3 illustrates a first exemplary embodiment of a frontside contact 100. The frontside contact 100 may contain a silicon substrate layer 102, a buried oxide layer 104, a field oxide layer 106, an implant 112, connection polysilicon 114, a contact dielectric layer 116, a contact plug 118, and a metal pad 120. As shown, the connection polysilicon 114 connects the silicon substrate layer 102 to the contact plug 118 providing a means to ground or bias the silicon substrate of a Silicon-On-Insulator (SOI) circuit. A method of fabricating the frontside contact 100 is described as follows.

Figure 4:
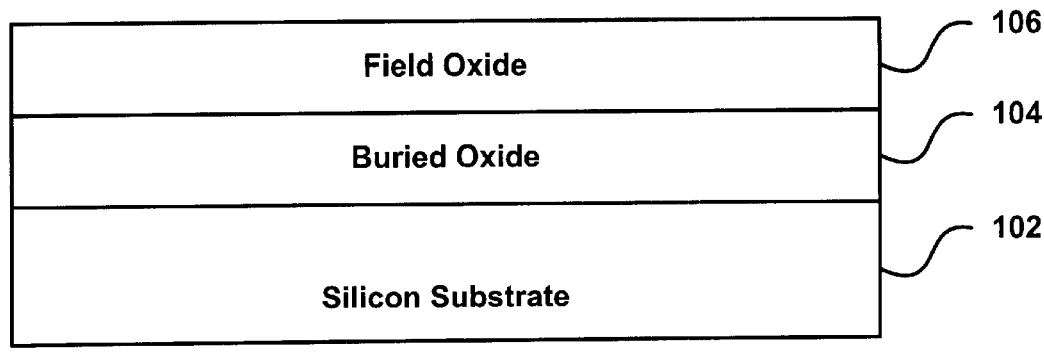
FIG. 4 is a cross sectional view of the frontside contact area after removal of top silicon and deposition of field oxide according to an exemplary embodiment.

FIG. 4 shows the frontside contact area during initial stages of processing according to an exemplary embodiment. The formation of the frontside contact 100 may begin by removing the top layer of silicon from an SOI wafer in the area in which the frontside contact 100 is to be formed, exposing the buried oxide layer 104. The top layer of silicon is not shown in FIG. 4. For example, the top layer of silicon may be removed using reactive ion etching (RIE). Other etching methods that are selective to the buried oxide layer 104 may also be used. The field oxide layer 106 may then be deposited on the buried oxide layer 104. Deposition may be performed using chemical vapor deposition or any other suitable method. The field oxide layer 106 may act as a protective layer and serve as a doping barrier.

Figure 5:
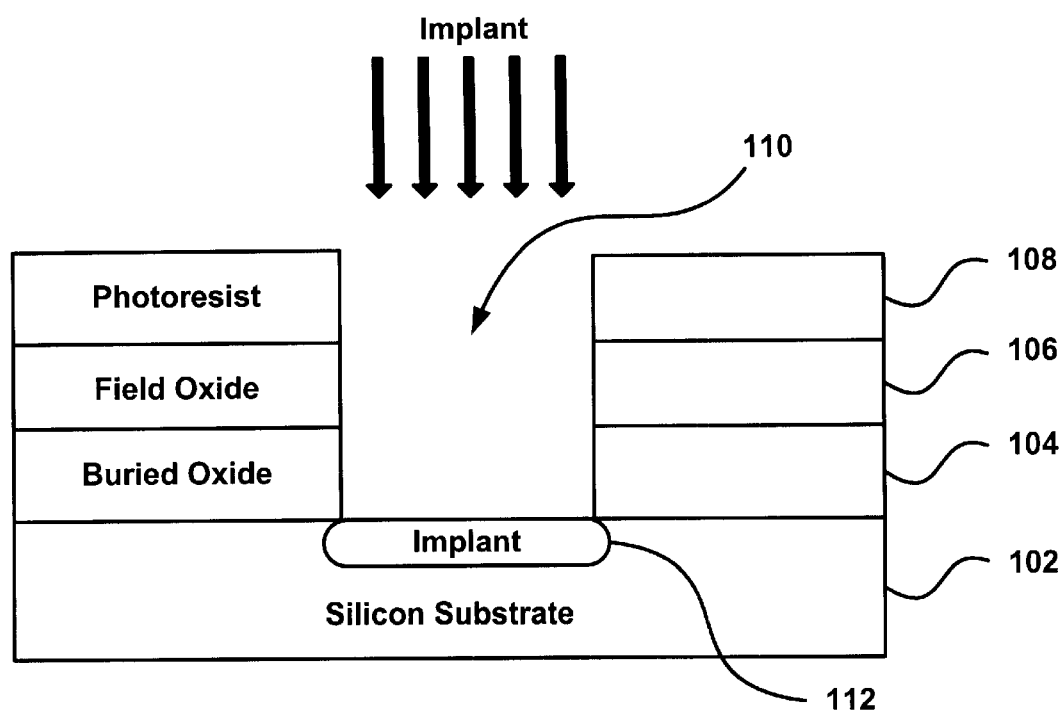
FIG. 5 is a cross sectional view of the frontside contact area after etch and implant according to an exemplary embodiment.

FIG. 5 shows the frontside contact area during additional stages of processing according to an exemplary embodiment. After the field oxide layer 106 is deposited, as shown in FIG. 4, a photoresist 108 with the pattern to be etched may be placed on the field oxide layer 106. A hole 110 may then be etched through the field oxide layer 106 and the buried oxide layer 104, down to the silicon substrate layer 102. A positive profile on the hole 110 may be beneficial, as outlined in a commonly assigned patent application "Method for Forming a Frontside Contact to the Silicon Substrate of a SOI Wafer in the Presence of Planarized Contact Dielectrics" (Ser. No. 09/163,687), which is incorporated by reference herein. The choice of an etching technique may be based on factors such as cost effectiveness. According to an exemplary embodiment, an industry standard straight walled RIE plasma etch is used.

After etching has created hole 110, the implant 112 may be performed through the hole 110 to increase the doping in the silicon substrate layer 102. The implant 112 may be either a P+ implant or an N+ implant. The implant 112 may be of sufficient conductivity to provide an electrical connection between the silicon substrate layer 102 and the connection polysilicon 114. According to an exemplary embodiment, a P+ implant 112 of substantially $1.25 \times 10^{15}$ atoms/cm$^2$ at 70 keV is performed in the silicon substrate layer 102 when the connection polysilicon 114 is doped N+, but other implants may be employed. In other embodiments, it may be beneficial to perform an N+ implant or no implant at all. After the implant 112 is performed, the photoresist 108 may be removed and the wafer cleaned.

Figure 6:
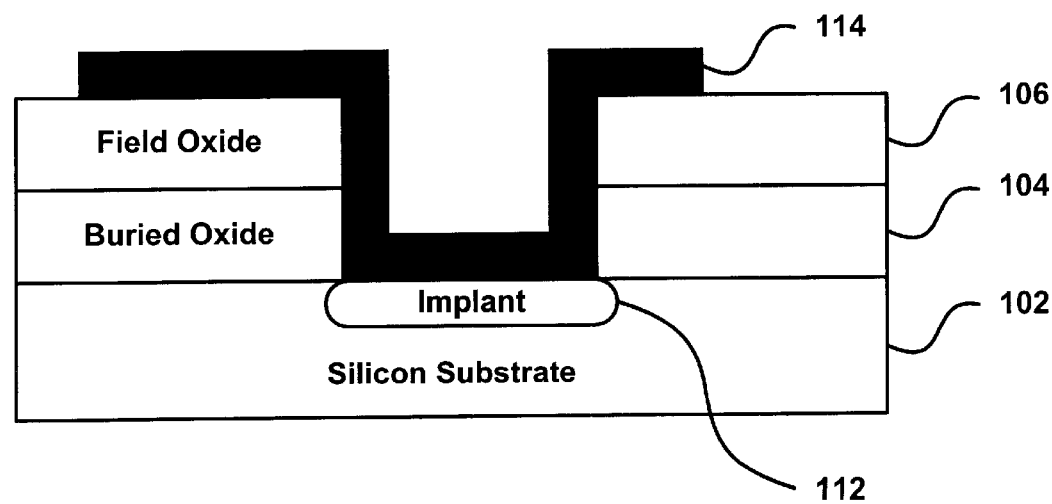
FIG. 6 is a cross sectional view of the frontside contact area after connection polysilicon is deposited according to a first exemplary embodiment.

FIG. 6 shows the frontside contact area during additional stages of processing according to an exemplary embodiment. The connection polysilicon 114 may be deposited on the wafer. The connection polysilicon 114 may be doped N+ or P+. Doping may be performed either before or after deposition. The choice of dopant and the timing of the doping may be determined based on other fabrication requirements on the wafer. For example, if other N+ doped polysilicon is needed for gate fabrication on the wafer, the same material may be used to form frontside contact 100 (See FIG. 3).

The connection polysilicon 114 may then be etched. A photoresist is typically used to define the edges of the connection polysilicon 114 prior to the etching process. The photoresist is not shown in FIG. 6. Any etching process that is compatible with the connection polysilicon 114 may be employed. According to an exemplary embodiment, this photoresist and etch process would occur concurrently with gate processing on the wafer. While FIG. 6 shows an exemplary embodiment of the connection polysilicon 114 after etching, the connection polysilicon is not limited to this shape. Any shape that provides a means to connect the silicon substrate layer 102 to the contact plug 118 may be employed.

Figure 7:
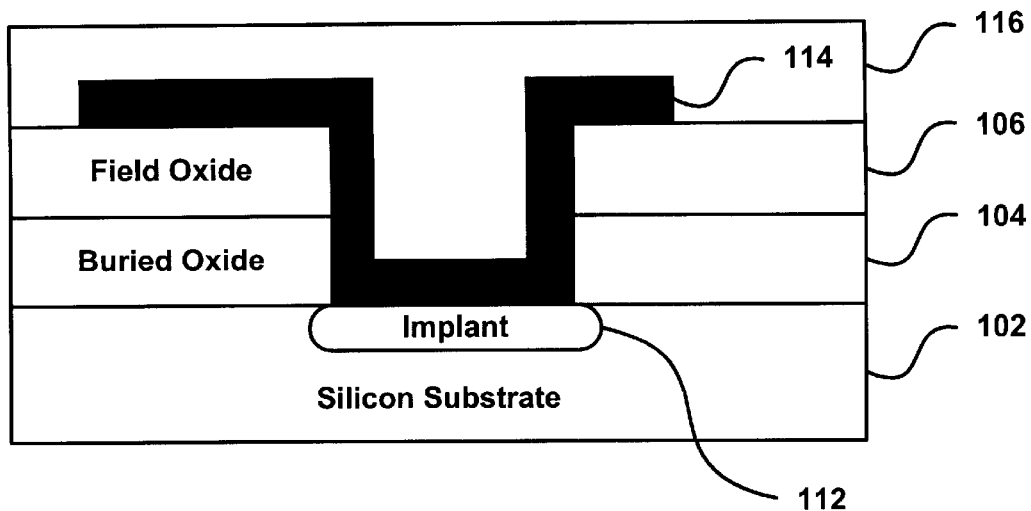
FIG. 7 is a cross sectional view of the frontside contact area after a contact dielectric layer is deposited according to a first exemplary embodiment.

FIG. 7 shows the frontside contact area during additional stages of processing according to an exemplary embodiment. The contact dielectric layer 116 may be deposited on the wafer. Planarization may then be performed to provide a flat surface on the wafer. Chemical mechanical polishing is performed in an exemplary embodiment, but other planarization techniques may also be employed. Since the frontside contact 100 may be at the same elevation as a normal gate contact, no additional selectivity requirements are necessary relative to a process flow that does not include the frontside contact 100.

Referring back to FIG. 3, a contact hole may then be etched through the contact dielectric layer 116. A refractory metal may be deposited in the contact hole to form the contact plug 118. In an exemplary embodiment, tungsten is employed; however, other metals, such as copper or aluminum, may also be suitable for this purpose. Other methods of connecting the connection polysilicon 114 to the top layer of the wafer may also be used. The metal pad 120 is located above the contact plug 118 to provide surface wiring to other components on the wafer. The metal pad 120 may be aluminum, but other conducting materials may be used for this purpose.

A silicide may be located between the contact plug 118 and the connection polysilicon 114. The silicide is not shown in FIG. 3. The silicide may be formed during the heat treatment step of alloying or may be deposited on the connection polysilicon 114 prior to depositing contact plug 118. Other barrier layers may also be employed. In another alternative embodiment, the silicide may not be used in forming the frontside contact 100.

Figure 11:
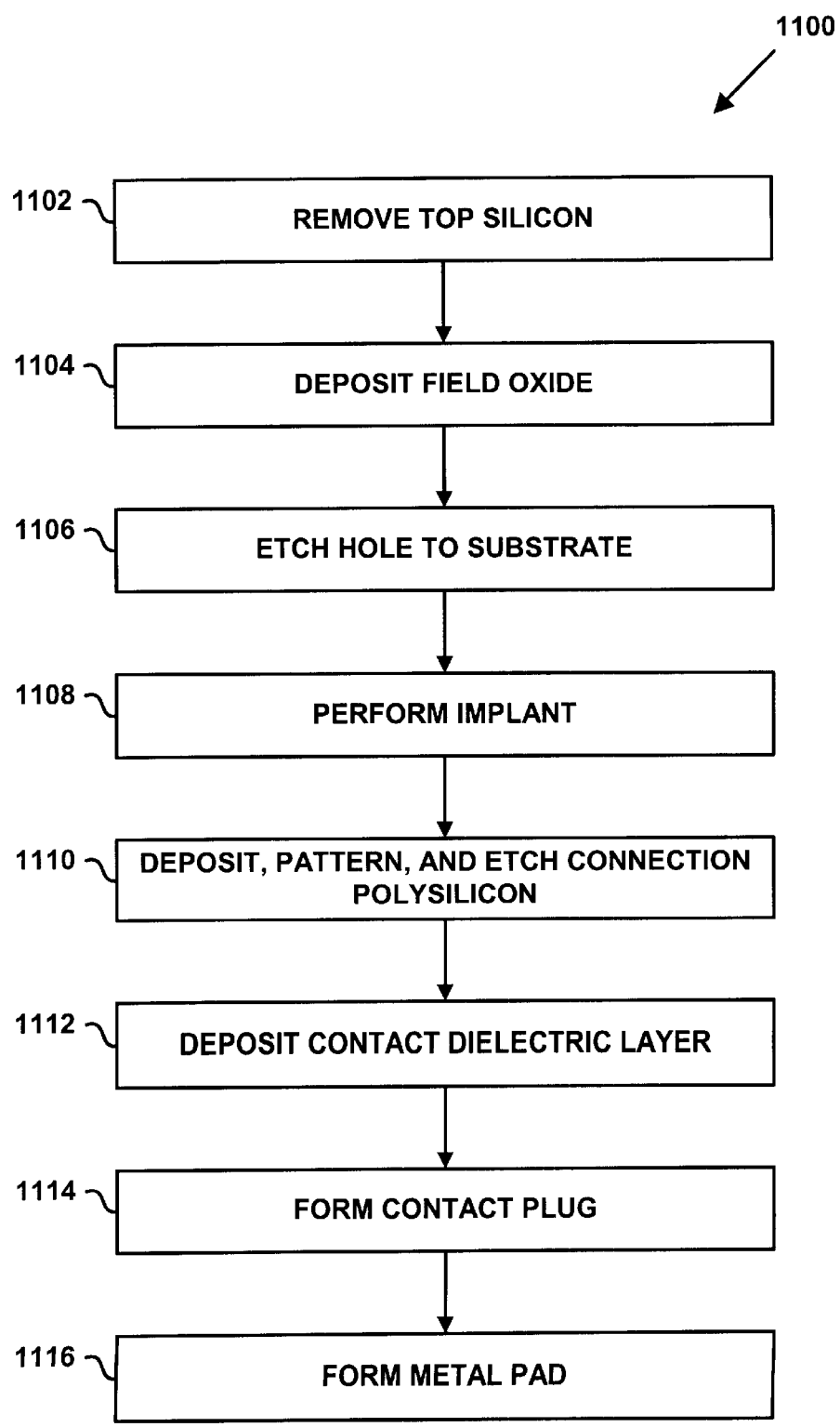
FIG. 11 is a flow diagram illustrating a method for forming a frontside contact according to a first exemplary embodiment.

FIG. 11 provides a flow diagram illustrating a method of forming the frontside contact 100 according to an exemplary embodiment. Method 1100 summarizes the process described above with reference to FIG. 3 through FIG. 7.

Second Exemplary Embodiment

Figure 8:
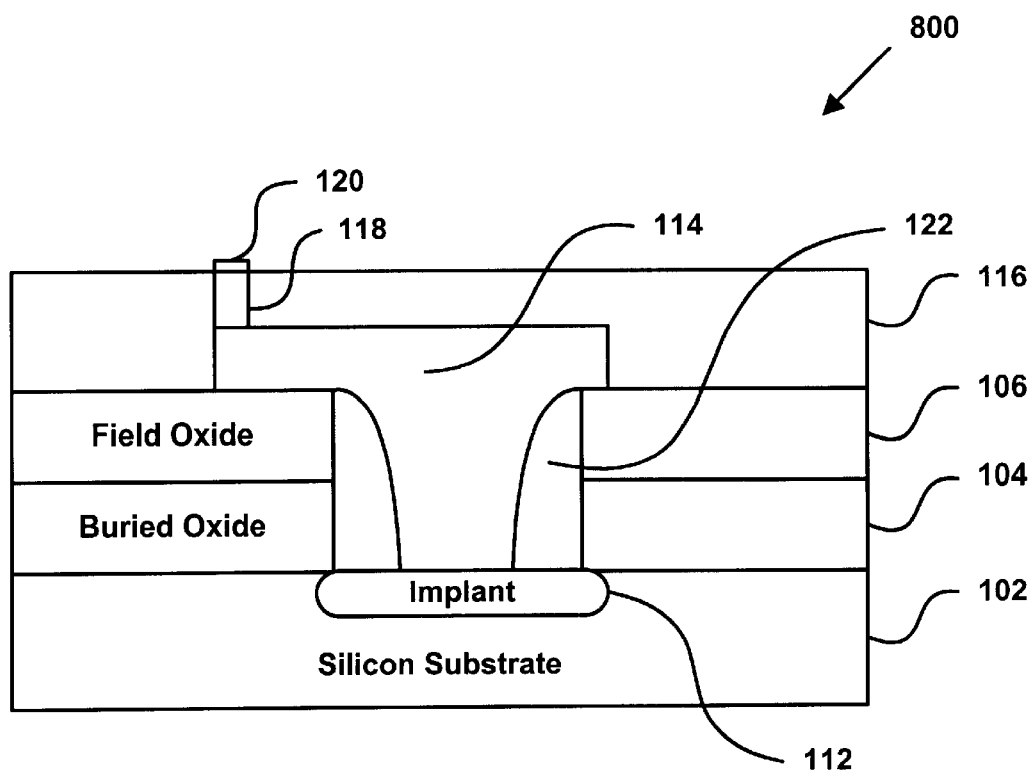
FIG. 8 is a cross sectional view of a frontside contact according to a second exemplary embodiment.

FIG. 8 illustrates a frontside contact 800 in accordance with another exemplary embodiment. The frontside contact 800 contains a silicon substrate layer 102, a buried oxide layer 104, a field oxide layer 106, an implant 112, connection polysilicon 114, a contact dielectric layer 116, a contact plug 118, a metal pad 120 and spacers 122. As shown, the connection polysilicon 114 connects the silicon substrate 102 to the contact plug 118 providing a means to ground or bias the silicon substrate of a SOI circuit.

Frontside contact 800 contains spacers 122 to provide additional doping. Spacers 122 may be needed when a circuit design requires a thick buried oxide layer 104. For example, if the frontside contact 800 thickness is in the range of 10,000 to 20,000 Angstroms, spacers 122 may be needed to provide sufficient doping. A method of fabricating the frontside contact 800 is described as follows.

FIG. 4 shows the frontside contact area during initial stages of processing according to an exemplary embodiment. The formation of the frontside contact 800 may begin by removing the top layer of silicon from an SOI wafer in the area in which the frontside contact 800 is to be formed, exposing the buried oxide layer 104. The top layer of silicon is not shown in FIG. 4. For example, the top layer of silicon may be removed using RIE. Other etching methods that are selective to the buried oxide layer 104 may also be used. The field oxide layer 106 may then be deposited on the buried oxide layer 104. Deposition may be performed using chemical vapor deposition or any other suitable method. The field oxide layer 106 may act as a protective layer and serve as a doping barrier.

FIG. 5 shows the frontside contact area during additional stages of processing according to an exemplary embodiment. After the field oxide layer 106 is deposited, as shown in FIG. 4, a photoresist 108 with the pattern to be etched may be placed on the field oxide layer 106. A hole 110 may then be etched through the field oxide layer 106 and the buried oxide layer 104, down to the silicon substrate layer 102. A positive profile on the hole 110 may be beneficial, as outlined in a commonly assigned patent application "Method for Forming a Frontside Contact to the Silicon Substrate of a SOI Wafer in the Presence of Planarized Contact Dielectrics" (Ser. No. 09/163,687), which is incorporated by reference herein. The choice of an etching technique may be based on factors such as cost effectiveness. According to an exemplary embodiment, an industry standard straight walled RIE plasma etch is used.

After etching has created hole 110, the implant 112 may be performed through the hole 110 to increase the doping in the silicon substrate layer 102. The implant 112 may be either a P+ implant or an N+ implant. The selection of implant dopant may be determined based on the dopant type of spacers 122 and the connection polysilicon 114. For example, if the spacers 122 and connection polysilicon 114 are P+, then a P+ implant may be preferred. The implant 112 may be of sufficient conductivity to provide an electrical connection between the silicon substrate layer 102 and the connection polysilicon 114. According to an exemplary embodiment, a P+ implant 112 of substantially $1.25 \times 10^{15}$ atoms/cm$^2$ at 70 keV is performed in the silicon substrate layer 102, but other implants may be employed. In other embodiments, it may be beneficial to perform an N+ implant or no implant at all. After the implant 112 is performed, the photoresist 108 may be removed and the wafer cleaned.

Figure 9:
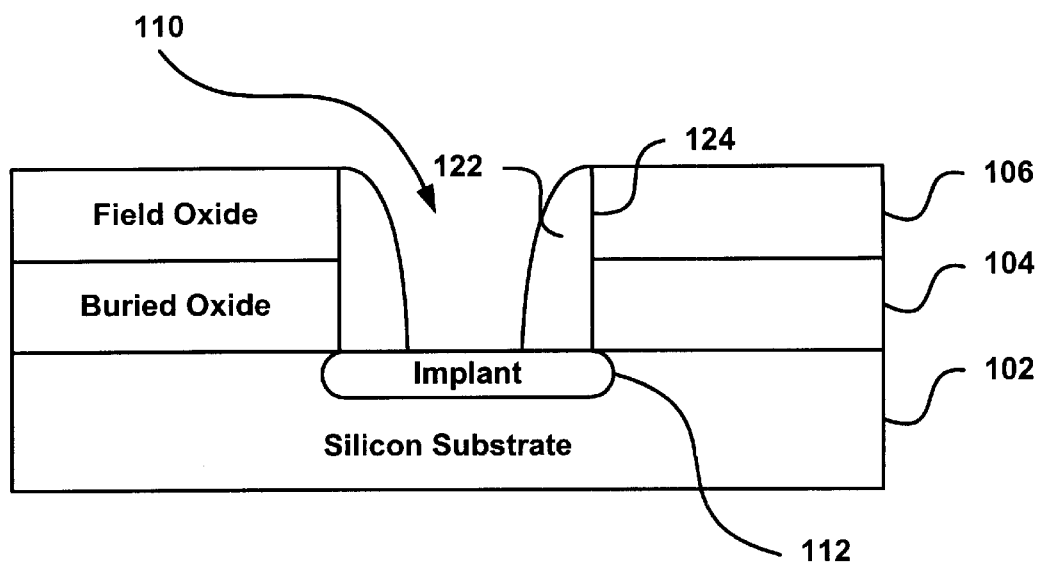
FIG. 9 is a cross sectional view of the frontside contact area after forming spacers according to a second exemplary embodiment.

FIG. 9 shows the frontside contact area during additional stages of processing according to an exemplary embodiment. In an exemplary embodiment, borosilicate glass may be deposited in the hole 110 and etched back to form spacers 122 along the frontside contact sidewalls 124. Borosilicate glass spacers may provide additional P+ doping. Any deposition and etching technique that is selective to borosilicate glass may be employed. Borosilicate glass is chosen as a doping source in an exemplary embodiment; however, other dopant materials may be used, including those that provide N+ doping.

Figure 10:
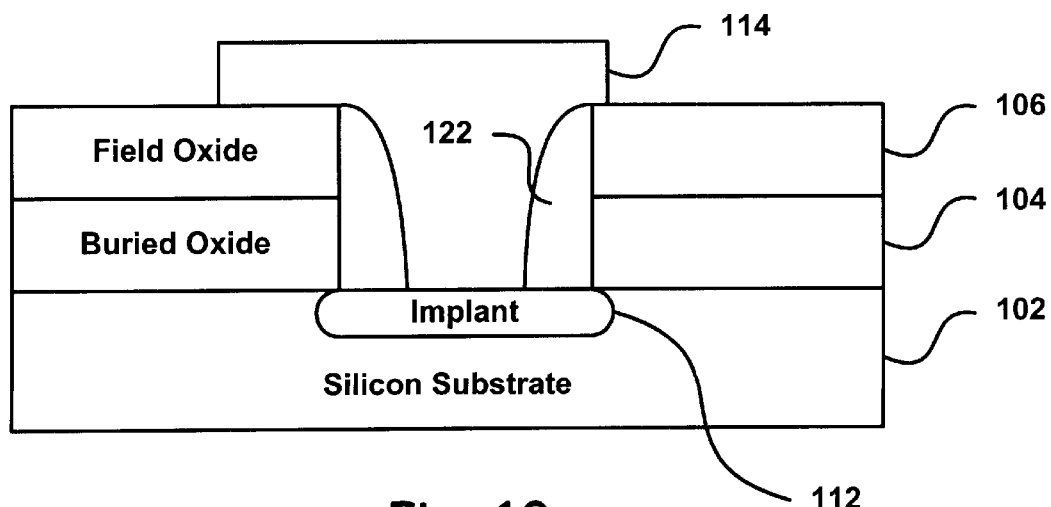
FIG. 10 is a cross sectional view of the frontside contact area after connection polysilicon is deposited according to a second exemplary embodiment.

FIG. 10 shows the frontside contact area during additional stages of processing according to an exemplary embodiment. The connection polysilicon 114 may be deposited on the wafer. In an exemplary embodiment, the connection polysilicon 114 may be deposited as undoped polysilicon. The connection polysilicon 114 may be doped N+ or P+ after deposition. In an alternative embodiment, the connection polysilicon 114 may be doped prior to or insitu during deposition. The selection of dopant type may be based upon the dopant type of the implant 112 and the spacers 122. For example, if the implant 112 and the spacers 122 are P+, then the connection polysilicon 114 may be doped P+. Other embodiments may employ different combinations of dopant types. For example, the implant 112, the spacers 122, and the connection polysilicon 114 may all be doped N+.

The connection polysilicon 114 may then be etched. A photoresist is typically used to define the edges of the connection polysilicon 114 prior to the etching process. The photoresist is not shown in FIG. 10. Any etching process that is compatible with connection polysilicon 114 may be employed. According to an exemplary embodiment, this photoresist and etch process would occur concurrently with gate processing on the wafer. While FIG. 10 shows an exemplary embodiment of the connection polysilicon 114 after etching, the connection polysilicon is not limited to this shape. Any shape that provides a means to connect the silicon substrate layer 102 to the contact plug 118 may be employed.

The source/drain/gate implants and anneals associated with typical Metal Oxide Semiconductor (MOS) transistor fabrication methods may be sufficient to dope a top region of the connection polysilicon 114. However, in a case of a deep and narrow frontside contact 800 opening, a dopant may not substantially diffuse to the interface of the silicon substrate layer 102. Out diffusion from the doped spacers 122 may provide for doping of the connection polysilicon 114 substantially to the interface of the silicon substrate layer 102.

Referring back to FIG. 8, the contact dielectric layer 116 may be deposited on the wafer. Planarization may then be performed to provide a flat surface on the wafer. Chemical mechanical polishing is performed in an exemplary embodiment, but other planarization techniques may also be employed.

A contact hole may then be etched through the contact dielectric layer 116. A refractory metal may be deposited in the contact hole to form the contact plug 118. In an exemplary embodiment, tungsten is employed; however, other metals, such as copper or aluminum, may also be suitable for this purpose. Other methods of connecting the connection polysilicon 114 to the top layer of the wafer may also be used. The metal pad 120 is located above the contact plug 118 to provide surface wiring to other components on the wafer. The metal pad 120 may be aluminum, but other conducting materials may be used for this purpose.

A silicide may be located between the contact plug 118 and the connection polysilicon 114. The silicide is not shown in FIG. 8. The silicide may be formed during the heat treatment step of alloying or may be deposited on connection polysilicon 114

We claim:

1. A method of forming a frontside contact on a silicon-on-insulator substrate, comprising in combination:

removing a top layer of silicon in an area where the frontside contact is to be formed, thereby substantially exposing a buried oxide layer;

depositing a field oxide layer on the buried oxide layer;

etching a hole through the field oxide layer and the buried oxide layer to a substrate layer;

performing an implant in the substrate layer through the hole;

depositing a connection polysilicon;

etching the connection polysilicon;

depositing a contact dielectric layer; and forming a contact plug.

2. The method of claim 1, further comprising forming a metal pad substantially above the contact plug.

3. The method of claim 1, further comprising depositing and etching at least one spacer to provide additional doping after the step of performing an implant.

4. The method of claim 3, wherein the at least one spacer is composed of borosilicate glass.

5. The method of claim 1, wherein the step of removing a top layer of silicon includes employing reactive ion etching.

6. The method of claim 1, wherein the step of etching a hole includes applying photoresist to substantially define the location to be etched.

7. The method of claim 1, wherein the step of etching a hole includes performing a straight wall etch.

8. The method of claim 1, wherein the step of performing an implant includes performing a P+ implant of substantially $1.25 \times 10^{15}$ atoms/cm$^2$ at 70 keV.

9. The method of claim 1, wherein the step of etching the connection polysilicon includes applying photoresist to substantially define a location to be etched.

10. The method of claim 1, wherein the step of forming a contact plug includes etching a contact hole in the contact dielectric layer.

11. The method of claim 1, wherein the step of forming a contact plug includes depositing a metal in the contact hole.

12. The method of claim 11, wherein the metal is tungsten.

13. The method of claim 11, wherein a silicide is substantially located between the metal and the connection polysilicon.

* * * * *

UNITED STATES PATENT AND TRADEMARK OFFICE
CERTIFICATE OF CORRECTION

PATENT NO. : 6,576,508 B2
DATED : June 10, 2003
INVENTOR(S) : Fechner et al.

Figure 12:
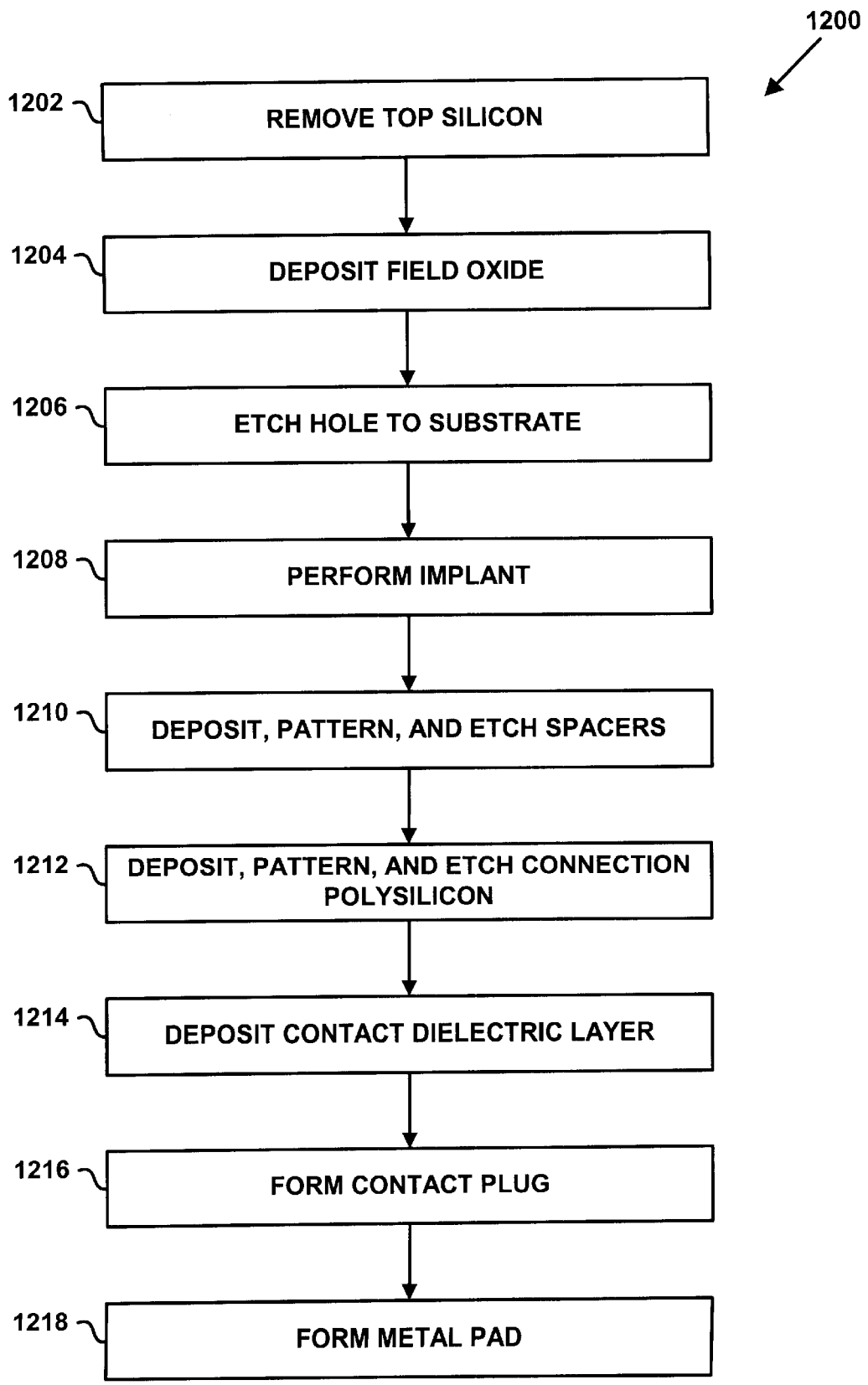
FIG. 12 is a flow diagram illustrating a method for forming a frontside contact according to a second exemplary embodiment.

It is certified that error appears in the above-identified patent and that said Letters Patent is hereby corrected as shown below:

Column 6,
Line 45, after "polysilicon 114" insert -- prior to depositing contact plug 118. Other barrier layers may also be employed. In another alternative embodiment, the silicide may not be used in forming the frontside contact 800.
　　　Fig. 12 provides a flow diagram illustrating a method of forming the frontside contact 800 according to an exemplary embodiment. Method 1200 summarizes the process described above with reference to Figures 4, 5, 8, 9, and 10.
Although two exemplary embodiments have been disclosed herein, other variations may be made without departing from the intended scope of the invention. For example, a variety of semiconductor fabrication techniques, including various methods of etching and deposition, may be employed without departing from the scope of the invention itself. The claims should not be read as limited to the described order or elements unless stated to that effect. Therefore, all embodiments that come within the scope and spirit of the following claims and equivalents thereto are claimed as the invention. --

Signed and Sealed this

Twenty-eighth Day of October, 2003

JAMES E. ROGAN
*Director of the United States Patent and Trademark Office*